United States Patent [19]

Fujioka et al.

[11] Patent Number: 5,012,173
[45] Date of Patent: Apr. 30, 1991

[54] CASING STRUCTURE FOR AN AMPLIFIER UNIT FOR AN AC SPINDLE

[75] Inventors: Yoshiki Fujioka; Tatsuo Shinohara, both of Yamanashi, Japan

[73] Assignee: Fanuc Ltd., Yamanashi, Japan

[21] Appl. No.: 334,275

[22] PCT Filed: Jun. 16, 1988

[86] PCT No.: PCT/JP88/00589
§ 371 Date: Dec. 29, 1988
§ 102(e) Date: Dec. 29, 1988

[87] PCT Pub. No.: WO88/10533
PCT Pub. Date: Dec. 29, 1988

[30] Foreign Application Priority Data

Jun. 16, 1987 [JP] Japan .................................. 62-148012

[51] Int. Cl.⁵ .......................... H02P 7/63; H05K 7/20
[52] U.S. Cl. ..................................... 318/727; 361/386
[58] Field of Search ............................... 361/380–395, 361/411–415; 307/149; 310/89; 455/347; 318/727

[56] References Cited

U.S. PATENT DOCUMENTS

| | | | |
|---|---|---|---|
| 4,092,570 | 5/1978 | Nakamoto | 361/392 X |
| 4,218,724 | 8/1980 | Kaufman | 361/395 |
| 4,399,486 | 8/1983 | Petsch | 361/383 X |
| 4,520,425 | 5/1985 | Ito | 361/384 |
| 4,621,200 | 11/1986 | Lovrenich | 307/149 |
| 4,769,557 | 9/1988 | Houf et al. | 361/383 X |
| 4,870,863 | 10/1989 | Duncan et al. | 361/395 X |
| 4,881,478 | 11/1989 | Sano | 361/394 X |

FOREIGN PATENT DOCUMENTS 54-115777 9/1979 Japan .
60-151202 10/1985 Japan .
WO88/10533 12/1988 World Int. Prop. O. .

Primary Examiner—Paul Ip
Attorney, Agent, or Firm—Armstrong, Nikaido, Marmelstein, Kubovcik & Murray

[57] ABSTRACT

An amplifier unit for an AC spindle, comprising a casing (10) and an amplifier integrally contained in the casing (10) and electrically interposed between an AC motor for driving the spindle of a machine tool and a power source. Component fixing seats respectively for receiving the attachments (18) of a plurality of electric circuit components (B, D, G, H) forming the amplifier thereon are formed in the plate-shaped section (12) and concave section (14) of the casing (10) at predetermined positions substantially in the ceiling plane of the casing (10), thin, lengthwise, plate-shaped ribs (22) are formed respectively around the predetermined positions to guide the electric circuit components (B, D, G, H) so that the attachments (18) of the electric circuit components (B, D, G, H) are seated respectively on the corresponding component fixing seats in alignment with the same, and the ribs (22) are provided respectively with inclined surfaces (24) for guiding the electric circuit components (B, D, G, H) when mounting the same on the casing (10) so that the electric circuit components (B, D, G, H) are positioned respectively at the predetermined positions.

6 Claims, 4 Drawing Sheets

CASING STRUCTURE FOR AN AMPLIFIER UNIT FOR AN AC SPINDLE

DESCRIPTION

1. Technical Field

The present invention relates to a casing structure for an amplifier unit for an AC spindle, namely, a casing structure for containing an amplifier unit which comprises various circuit components, for amplifying power supplied from a power source and supply amplified driving power to an AC motor for rotatively driving the spindle of a machine tool, and structurally capable of forming an individual amplifier assembly, and more particularly, to an improved casing structure for such an amplifier unit for an AC spindle, capable of enabling an efficient automatic assembly of the amplifier unit before the unit is accommodated in a power panel forming the electrical assembly of a machine tool, and capable of being formed in a lightweight construction.

2. Background Art

A desired power is supplied to an AC motor for rotatively driving the spindle of a machine tool at a high speed, from a power source through an AC amplifier provided on and contained in a power panel provided as one of the components of the electrical assembly or an electrical unit. Usually, to receive power from a three-phase power source and to supply a desired current necessary for rotatively driving the AC motor, such an AC amplifier comprises various circuit components, such as an electric contactor circuit for switching, a reactor circuit for shutting off external noise signals and for preventing the emission of noise signals, a rectifying circuit, a power amplifier circuit, and an inverter circuit. Conventionally, these circuit components are those available on the market and are arranged within the casing so as to meet the output level of the AC motor, and then the assembly of the circuit components and the casing is, attached to the power panel. The casing employs a box formed by cutting and bending an inexpensive steel plate or the like, the circuit components are arranged within the box so that the circuit components are concealed in the casing, and then the circuit components are screwed firmly to the bottom wall of the box.

In process for assembling the amplifier unit for the AC spindle by screwing the circuit components of the amplifier unit to the bottom wall of the box formed of a metallic plate, the bit of a screw driver, namely, a tool for assembling the amplifier unit, must be necessarily inserted deep into the box near to the bottom wall of the box along the circuit components, the tip of the screw driver inserted in the head of a screw, and the screw driver then turned to fasten the circuit unit with the screw. Accordingly, in assembling the amplifier unit by an automatic assembling process, for example, an assembling process employing an industrial robot, an assembling process including inserting a screw driver gripped at the extremity of a robot hand in the box and rotating the screw driver to fasten the screw requires a step of lowering the robot hand to a position at which the tip of the screw driver is inserted in the head of the screw, and a step of raising the robot hand after fastening the screw, and this is one of the factors that adversely affects the efficiency of the automatic assembling process and remarkably reduces the working efficiency. Accordingly, there is a demand for a novel casing structure having an improved design for an amplifier unit for an AC spindle, capable of enabling a highly efficient automatic assembly of the amplifier unit by using an industrial robot.

DISCLOSURE OF THE INVENTION

Accordingly, an object of the present invention is to provide a novel casing structure for an amplifier for an AC spindle, meeting this demand.

Another object of the present invention is to provide a casing structure to facilitate an automatic assembly of an amplifier unit for an AC spindle by the end effector of a manipulator for such an automatic assembly, such as an industrial robot.

The present invention provides an amplifier unit for an AC spindle, electrically interposed between an AC motor for driving the spindle of a machine tool and a power source and comprising a plurality of circuit components forming an electric amplifier integrally contained in a single casing having a ceiling means opening upward, seat means formed on the ceiling means respectively at predetermined positions in a predetermined arrangement so as to fixedly receive the attachments of the plurality of circuit components of the electric amplifier thereon, respectively, and positioning plate means disposed respectively around the predetermined positions to guide the circuit components so that the attachments of the circuit components are aligned with and seated on the corresponding fixing seat means, respectively. In assembling this amplifier unit for the AC spindle, the process for inserting the screw driver for fastening the screws in the interior of the casing by the robot is omitted because the plurality of circuit components are fastened to the ceiling means of the casing, and thus the efficiency of the assembly work is enhanced and the positioning plate means enables an accurate positioning of the circuit components respectively at the predetermined positions by the automatic operation of the robot. Preferably, the casing is a molded structure formed of a synthetic resin to form the amplifier unit for the AC spindle in a lightweight construction.

BRIEF DESCRIPTION OF THE DRAWINGS

The above and other objects, features and advantages of the present invention will become more apparent from the following description taken in conjunction with the accompanying drawings, in which.

BEST MODE OF CARRYING OUT THE INVENTION

Figure 4:
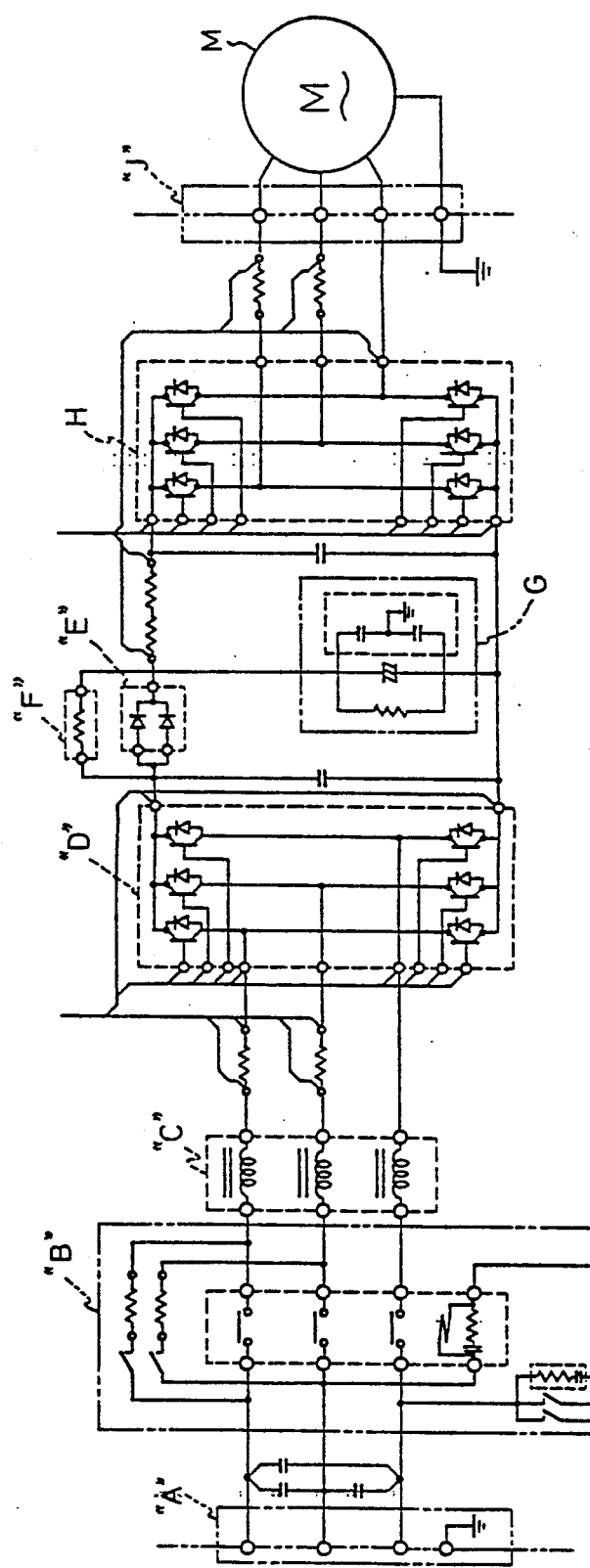
FIG. 4 is a circuit diagram exemplifying one of various amplifiers for an AC spindle.

First, referring to FIG. 4 showing a circuit diagram of an amplifier for an AC spindle, the amplifier comprises electric circuits including an input terminal unit A, an electromagnetic contactor B, a reactor circuit C for shutting off noise from external circuits and for preventing the emission of noise generated by the switching operation of the amplifier, a rectifying bridge circuit D comprising a plurality of transistors, a power diode circuit E, the resistance F of the energy regenerating circuit of an AC motor M, a capacitor G for storing the regenerated energy, an inverter circuit H comprising a plurality of transistors, and an output terminal unit J. The amplifier supplies a desired power to the AC motor M for driving the spindle. These electric circuits are individual, integral electric components, respectively.

The construction of a casing for accommodating the circuit components A to J will be described hereinafter with reference to FIGS. 1 to 3. The casing 10 embodying the present invention is a lightweight, molded box of a synthetic resin, comprising a plate-shaped section 12 for holding the comparatively flat circuit components, and a concave section 14 for holding the comparatively thick circuit components. Terminal mounts 16a and 16b respectively for holding the input terminal unit A and the output terminal unit J are provided on one side of the casing 10. Indicated at 16c is a grounding terminal mount.

Figure 1:
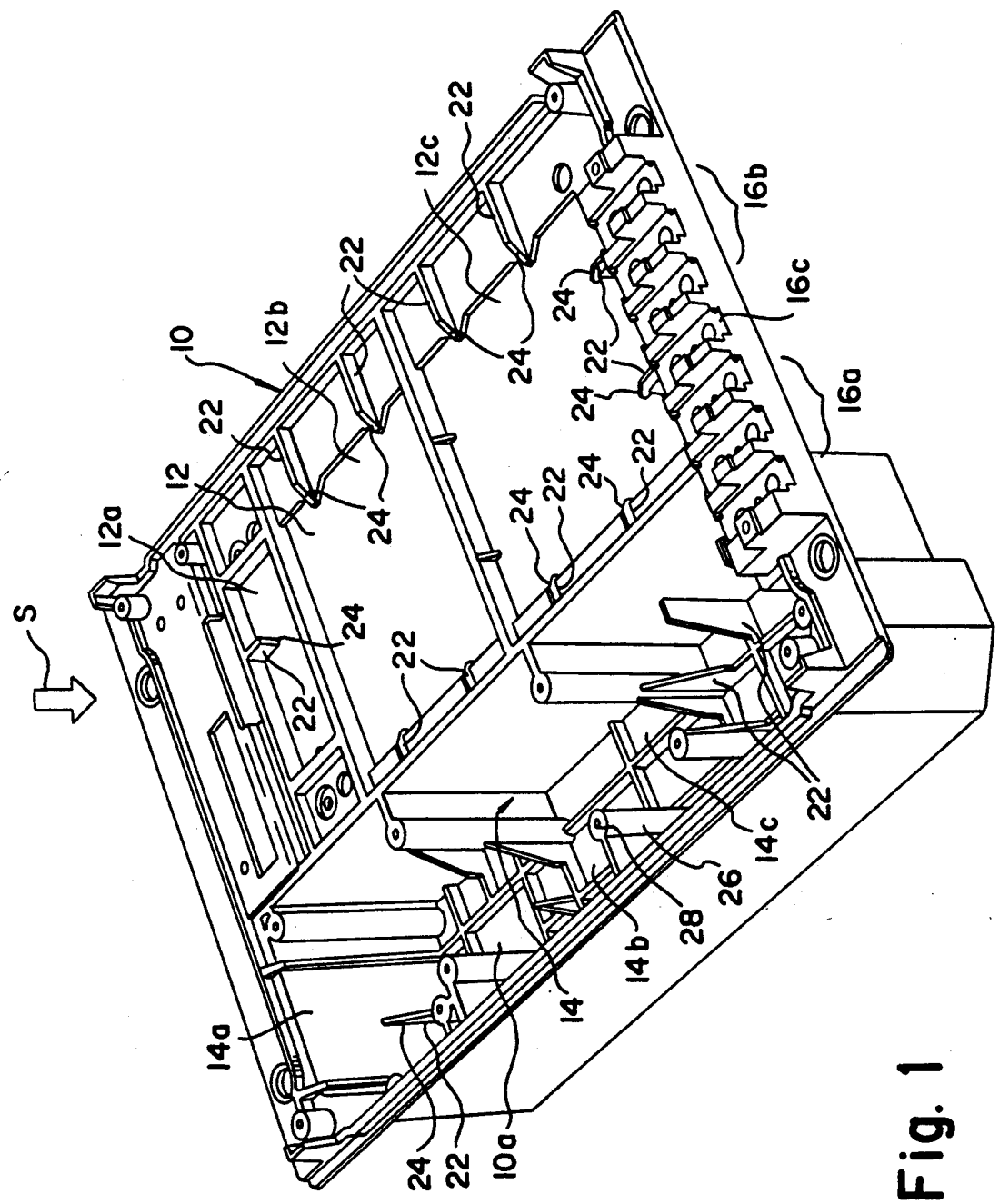
FIG. 1 is a perspective view of a casing embodying the present invention, for an amplifier unit for an AC spindle.
Figure 3:
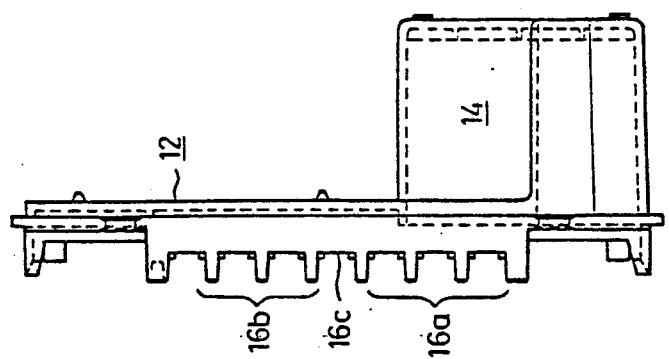
FIG. 3 is a side elevation showing one side face of the casing of FIG. 1.
Figure 2:
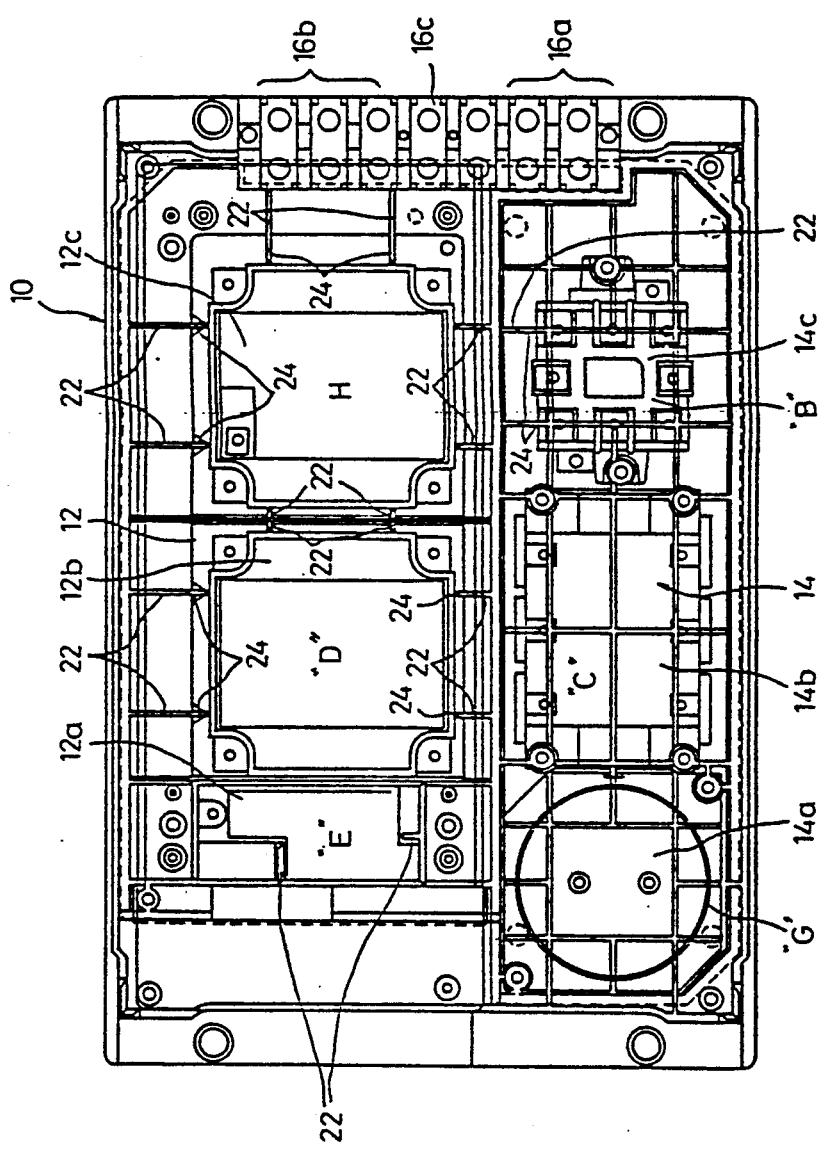
FIG. 2 is a top plan view of the casing of FIG. 1.

Referring to FIGS. 2 and 3 in combination with FIG. 1, the plate-shaped section 12 has, in a sequential arrangement from left to right as viewed in the drawings, mounting areas 12a to 12c to be mounted respectively with the power diode circuit E, the rectifying bridge circuit D, and the inverter circuit H. The concave section 14 has, in a sequential arrangement from left to right as viewed in the drawings, mounting areas 14a to 14c to be mounted respectively with the capacitor G, the reactor circuit C, and the electromagnetic contactor B. Component fixing seats are formed in the mounting areas 12a to 12c in the upper ceiling surface of the casing 10, and the components E, D, and H are positioned on the component fixing seats. As is obvious from FIG. 2, fastening screws or bolts, not shown, are passed through through-holes 20 formed in the attachments 18 of the circuit component in the direction of an arrow S, by the hand of an industrial robot, and then the fastening screws are turned with a screw driver, not shown, gripped by the hand to fasten the attachments to the fixing seat to complete the mounting of the circuit component. Threaded holes are formed beforehand in the fixing seats at positions respectively corresponding to the through-holes 20 of the attachments 18 of the circuit components E, D, and H, or a separate fixing plate is disposed behind the plate-shaped section 12 and threaded holes are formed at positions respectively corresponding to the through-holes 20 of the attachments 18. Further, threaded holes are formed in a different casing of a different electric unit of the electric assembly of a machine tool at positions respectively corresponding to the through-holes 20 of the attachments 18 to enable the simple attachment of the electric components to the different casing by a fixing operation from above the casing 10.

It should be particularly noted that a plurality of lengthwise plate-shaped ribs 22 each having an inclined surface 24 declining toward the corresponding fixing seat are formed around the mounting areas 12a, 12b, and 12c forming the fixing seat for the electric components, to mechanically reinforce the ceiling surface of the casing 10. These inclined surfaces 24 have the function of a template for guiding the circuit components E, D, and H and automatically positioning the circuit components E, D, and H at the respective centers of the fixing seats when lowering the circuit components E, D and H from above the casing 10, and positioning the same in the corresponding fixing seats by the robot. Accordingly, when assembling the amplifier unit for the AC spindle by means of the industrial robot, the circuit components E, D, and H can be accurately positioned in the corresponding fixing seats.

Figure 5:
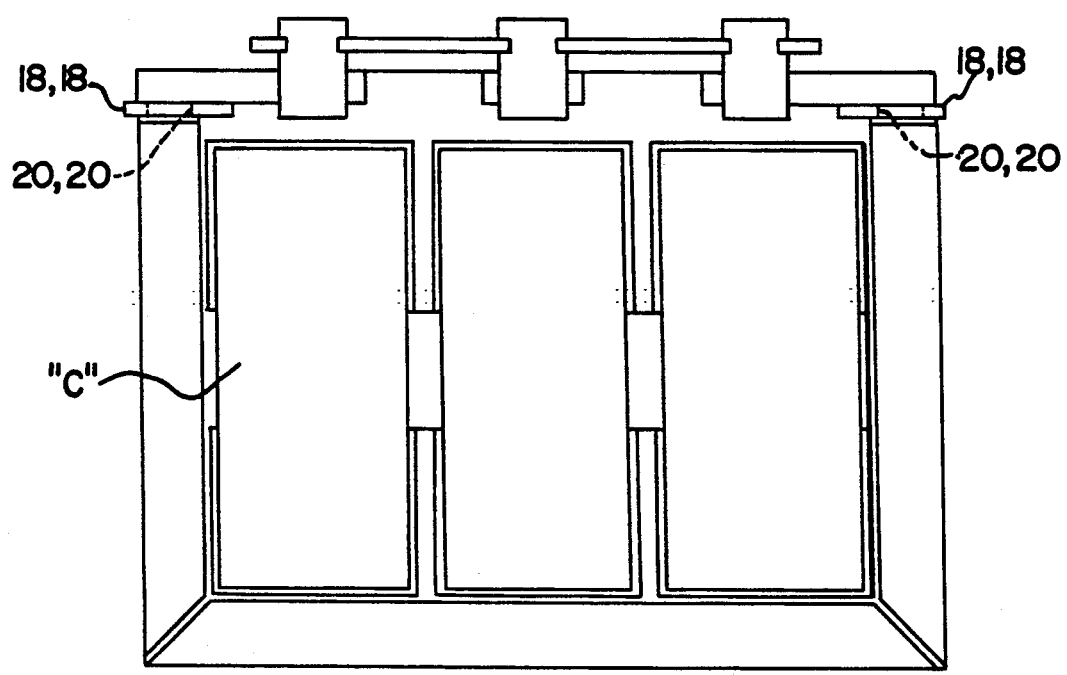
FIG. 5 is a side elevation of one of the circuit components shown in FIG. 2.

On the other hand, the concave section 14 has supporting posts 26 extending upward from the bottom surface 10a of the casing 10 in the mounting areas 14a to 14c. The supporting posts 26 for receiving the attachments 18 of the reactor circuit C thereon are shown in FIG. 5 by way of example. Threaded holes 28 are formed respectively in the upper ends of the supporting posts 26. The fastening screws, not shown, are passed through the through-holes 20 formed in the attachments 18 of the circuit component, for example, the reactor circuit C, from above the casing 10 in the direction of the arrow S and, as mentioned above, the fastening screws are fastened by the robot to fasten the circuit component to the ceiling section 14 through a fastening operation above the casing 10. Furthermore, thin, lengthwise, plate-shaped ribs 22 are formed, similar to those formed in the plate-shaped section 12, around the mounting areas 14a to 14c of the concave section 14 so that the circuit components F, C, and B are positioned automatically at predetermined positions respectively by the guiding function of the inclined surfaces 24 declining inward when the circuit components F, C, and B gripped by the robot are lowered. Therefore, the circuit components F, C, and B are positioned so that the attachments 18 thereof are placed accurately on the corresponding supporting posts 26 to facilitate the subsequent screwing operation for fastening the circuit components F, C, and B to the supporting posts 26.

Furthermore, fixing seats 30 for joining the casing 10 to other electric equipment on the power panel of the electric unit of the machine tool is provided in the periphery of the casing 10. Naturally, the casing 10 may be provided with additional fixing seats in preparation for fixing circuit components other than foregoing circuit components thereto, when necessary. Although not shown, the casing 10 may be provided on the walls thereof with radiating fins, to improve the heat-radiating effect of the circuit components or a cover member provided with radiating fins may be provided on the ceiling surface to promote the effect of heat radiation from the interior of the casing 10.

As is apparent from the foregoing description, the structure of the casing in accordance with the present invention for an amplifier unit for an AC spindle enables assembly work, such as a positioning operation and a screwing operation, to be carried out above the casing, namely, in the ceiling section, when attaching the electrical circuit components A to J of the amplifier unit to the casing. Accordingly, when carrying out the automatic assembly of the amplifier unit for the AC spindle along a production line by using a manipulator, such as an industrial robot, the stroke of the end effector held on the extremity of the robot can be reduced to the minimum necessary extent; that is, compared with the conventional assembly work in which the screw driver for fastening the screws is inserted deep into the interior of the casing to fasten the screw and then the screw driver is raised after fastening the screw, the stroke of the screw driver in the assembling work to attach the amplifier components to the casing of the present invention is remarkably reduced. Furthermore, the thin, lengthwise, plate-shaped ribs improve the accuracy of positioning the electric components of the amplifier unit. Moreover, since this casing is formed in a lightweight construction by molding a synthetic resin, the overall weight of the amplifier unit for the AC spindle is reduced.

The foregoing casing is designed in an appropriate shape and size determined in connection with the number and shape of the circuit components to be mounted on the casing and, of course, the shape and size of the casing are not limited to those shown in the drawings. That is, it is obvious that the casing may be formed in an optional shape and size without departing from the technical idea of attaching the circuit component to the ceiling surface and forming the inclined surfaces having the function of a template respectively in the ribs.

While the invention has been particularly shown and described in reference to preferred embodiments thereof, it will be understood by those skilled in the art that changes in form and details may be made therein without departing from the spirit and scope of the invention.

We claim:

1. An amplifier unit for an AC spindle, formed between an AC spindle motor and a power source, having a plurality of circuit components which make up an electric amplifier and a casing for accommodating therein said circuit components, said casing comprising:
   a housing means having an opening at an upper portion thereof for receiving said plurality of circuit components;
   fixing seat means formed at predetermined positions on said housing means for respectively receiving attachments of said plurality of circuit components; and
   positioning plate means formed at predetermined positions on said housing means for respectively guiding said plurality of circuit components so that said circuit component attachments are aligned with and respectively seated on said fixing seat means, wherein the positioning plate means of said casing is a lengthwise, thin plate-shaped rib having an inclined surface declining toward said predetermined positions.

2. An amplifier unit for an AC spindle according to claim 1, wherein through holes are formed respectively in the attachments of said plurality of circuit components, and threaded holes are formed in the fixing seat means of said casing corresponding to the through-holes of the attachments to be seated thereon, wherein said circuit component attachments include through holes, and wherein said fixing seat means include threaded holes corresponding to said through holes of said circuit component attachments.

3. An amplifier unit for an AC spindle according to claim 2, wherein said fixing seat means comprises lengthwise supporting posts, and said threaded holes are formed in free ends of the supporting posts.

4. An amplifier unit for an AC spindle according to claim 1, wherein said casing having said fixing seat means and said positioning plate means is formed by molding a synthetic resin.

5. An amplifier unit for an AC spindle according to claim 1, wherein said plurality of circuit components are an electromagnetic contactor circuit assembly having input terminals to be connected to a power source, a reactor circuit assembly, a rectifier circuit assembly, a power diode circuit assembly and an inverter circuit assembly, said plurality of circuit components are electrically connected sequentially, said electric amplifier is connected to input terminals of said AC motor, and said plurality of circuit components are contained in said casing.

6. An amplifier unit for an AC spindle, formed between an AC spindle motor and a power source, having a plurality of circuit components which make up an electric amplifier and a casing for accommodating therein said circuit components, said casing comprising:
   a housing means having an opening at an upper portion thereof for receiving said plurality of circuit components;
   fixing seat means formed at predetermined positions on said housing means for respectively receiving attachments of said plurality of circuit components, said fixing means including lengthwise supporting posts, each having a free end thereof provided with a threaded hole formed therein and corresponding to a through-hole formed in each of said attachments of said plurality of circuit components; and
   positioning plate means formed at predetermined positions on said housing means for respectively guiding said plurality of circuit components so that said circuit component attachments are aligned with and respectively seated on said fixing seat means.

* * * * *